(12) United States Patent
Mouri et al.

(10) Patent No.: US 6,340,088 B1
(45) Date of Patent: Jan. 22, 2002

(54) STORAGE CONTAINER FOR ELECTRONIC COMPONENTS

(75) Inventors: Akira Mouri; Kiyoyuki Nakagawa, both of Takefu; Kenichi Fukuda, Sabae, all of (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 09/345,730

(22) Filed: Jul. 1, 1999

(30) Foreign Application Priority Data

Jul. 28, 1998 (JP) ............................................ 10-228604

(51) Int. Cl.[7] .............................................. B65D 85/00
(52) U.S. Cl. ......................... 206/720; 206/722; 53/479
(58) Field of Search .................................. 206/701, 719,
206/720, 721, 722, 723; 53/476, 477, 479;
220/495.06; 383/36, 207, 209, 202, 906;
493/194, 199, 227

(56) References Cited

U.S. PATENT DOCUMENTS

| | | | |
|---|---|---|---|
| 2,103,389 A | * 12/1937 | Salfisberg | 383/209 |
| 2,446,308 A | * 8/1948 | Smith | 383/906 |
| 2,635,788 A | * 4/1953 | Synder et al. | 383/209 |
| 3,186,625 A | * 6/1965 | Mead et al. | 383/202 |
| 3,224,640 A | * 12/1965 | Schneider et al. | 383/209 |
| 4,889,229 A | * 12/1989 | Yamamoto et al. | 206/723 |
| 4,911,562 A | * 3/1990 | Mazzeschi | 383/906 |
| 5,228,782 A | * 7/1993 | Imer | 383/906 |
| 5,735,408 A | * 4/1998 | Fukuda et al. | 206/723 |

FOREIGN PATENT DOCUMENTS

| | | |
|---|---|---|
| JP | 63-22378 | 1/1988 |
| JP | 8-301383 A | 11/1996 |
| JP | 9-254996 | 9/1997 |
| JP | 10-129784 A | 5/1998 |

* cited by examiner

*Primary Examiner*—Luan K. Bui
(74) *Attorney, Agent, or Firm*—Burns, Doane, Swecker & Mathis, LLP

(57) ABSTRACT

Electronic components can be reliably supplied from a storage container for electronic components, which is easy to manufacture and highly economical, to a mounting device. The storage container for electronic components includes a storage region, in which electronic components are stored, a discharge hole, a lead portion for leading the electronic components to the discharge hole, the end of the lead portion becoming the discharge hole, a discharge hole side lead portion, provided with a taper (guide angle) so that its width becomes narrower toward the discharge hole, and a storage region side lead portion, positioned between the storage region and the discharge hole side lead portion, and provided with a taper (guide angle) so that its width becomes narrower toward the discharge hole side lead portion. In addition, the taper (guide angle) of the storage region side lead portion may be larger than the taper (guide angle) of the discharge hole side lead portion.

23 Claims, 4 Drawing Sheets

STORAGE CONTAINER FOR ELECTRONIC COMPONENTS

BACKGROUND OF THE INVENTION

1. Field of the Invention

The present invention relates to a storage container for electronic components, and more particularly to a bag-like storage container which has excellent storability of electronic components, is highly economical, and can easily and reliably supply electronic components to a mounting device.

2. Description of the Related Art

Conventionally, various storage methods have been used as a storage (packaging) system for electronic components, such as taping, in which a plurality of electronic components are held with tape, case-filling, in which the components are stored in a case, magazine-filling, and bag-filling, in which the components are stored in a bag-like container. Case-filling and bag-filling are for storing electronic components in bulk, with bag-filling being the most economical of the above storage methods.

Referring to FIG. 6, a bag-like storage container used in conventional bag-filling storage is illustrated. As shown in FIGS. 7A and 7B, the storage container 51 used in this example is cylindrical, and prior to storing the electronic components, a bottom end 51b of a member 51a, which has a rectangular shape when made flat (FIG. 7A), is sealed by a method such as heat deposition, as shown in FIG. 7B. After the electronic components D have been inserted, a top end 51c is sealed by a method such as heat deposition (FIG. 6). An information display 52 displays information representing component type and the like, and is provided on the surface side of the storage region of the electronic components.

Polypropylene or polyethylene or the like, which has been processed to prevent static electricity occurring on its inner rim face, is used as the material for the storage container 51.

To mount the electronic components stored in this storage container 51, a discharge hole is created by cutting part of the bag with a knife, and the electronic components are inserted from this discharge hole to an electronic component insertion hole of the mounting device, and mounted.

However, the conventional storage method described above has problems such as the following:

(1) When supplying the electronic components to the electronic component insertion hole of the mounting device, it is difficult to accurately insert the electronic components from the discharge hole of the storage container to the electronic component insertion hole of the mounting device.

(2) A bridge phenomenon sometimes occurs in which the electronic components get stuck or lodged near the discharge hole of the storage container. As a result, it becomes impossible to supply the electronic components from the storage container, resulting in poor reliability.

SUMMARY OF THE INVENTION

The present invention solves the problems described above and aims to provide an improved storage container for electronic components from which electronic components can be easily and reliably inserted into an electronic component insertion hole of a mounting device, and which is inexpensive to manufacture and extremely economical.

A storage container for electronic components of the present invention is a bag-like storage container for storing a plurality of electronic components which are to be mounted using a mounting device. The storage container comprises a storage region and a lead portion, with the plurality of electronic components being stored in the storage region. The lead portion has a narrower width than the storage region and is provided with a taper (guide angle) so that the width of the lead portion becomes narrower closer toward its end, the end being a discharge hole. When supplying the electronic components to an electronic component injection hole of a mounting device, the discharge hole is opened and the electronic components are supplied from the storage region via the lead portion and the discharge hole, and then from the electronic component insertion hole of the mounting device to the mounting device.

A storage container for electronic components of the present invention comprises a storage region, in which a plurality of electronic components are stored, and a lead portion, having a narrower width than the storage region and being provided with a taper (guide angle) so that its width becomes narrower toward its end, the end being a discharge hole. The discharge hole is opened and electronic components are supplied from the storage region via the lead portion and the discharge hole. Therefore, there is no bridge phenomenon which could cause the electronic components to get stuck or lodged near the discharge hole of the storage container, thus enabling the electronic components to be reliably supplied from the storage region to a mounting device.

There are no special constraints on the material from which the storage container for electronic components of the present invention is constructed, but polypropylene, polyethylene, and the like are examples of preferable materials. Furthermore, by using a material which has been processed to prevent static electricity on its inner rim face, the surface which touches the electronic components, it is less likely to suffer from static electricity and the electronic components can be even more smoothly removed.

Furthermore, when dimensioning the discharge opening in the present invention, one skilled in the art should recognize that there are a variety of possibilities for the electronic component insertion hole of a mounting device, such as a top opening of a conical-shaped insertion hopper provided vertically, or an opening in an end of a square hopper provided diagonally, and there are no constraints regarding its name or specific shape and dimensions or the like.

The lead portion includes a discharge hole side lead portion, the end thereof being a discharge hole, and a taper (guide angle) θ1 being provided so that its width becomes narrower closer toward the discharge hole. The lead portion also includes a storage region side lead portion, positioned between the storage region and the discharge hole side lead portion, a taper (guide angle) θ2 being provided so that its width becomes narrower closer toward the discharge hole side lead portion. Consequently, the electronic components in the storage region can flow to the discharge hole side lead portion without delay. In addition, the taper (guide angle) θ2 of the storage region side lead portion is preferably larger than the taper (guide angle) θ1 of the discharge hole side lead portion.

The discharge hole side lead portion has the discharge hole at its end, and a taper (guide angle) θ1 is provided so that its width becomes narrower toward the discharge hole. The storage region side lead portion, which becomes narrower toward the discharge hole side lead portion, is provided between the storage region and the discharge hole side lead portion. In addition, when the taper (guide angle) θ2 of the storage region side lead portion is larger than the taper (guide angle) θ1 of the discharge hole side lead portion, the length of the storage region side lead portion can be shortened so that the whole storage container can be made smaller. Further, since the taper (guide angle) θ1 at the discharge hole side lead portion is less severe than the taper (guide angle) θ2 of the storage region side lead portion, the electronic components can be even more smoothly supplied to the mounting device, thereby improving the efficiency of the present invention.

Preferably, the discharge hole, provided at the end of the lead portion, is shaped such that it can be inserted into the electronic component insertion hole of a mounting device. When the discharge hole, provided at the end of the lead portion, is shaped so that it can be inserted into the electronic component insertion hole of a mounting device, the electronic components can be reliably supplied to the mounting device without spilling. Dimensioning and shaping the discharge hole so as to enable it to be inserted into the electronic component insertion hole of the mounting device is a broad concept including, for instance, making the discharge hole smaller than the electronic component insertion hole of the mounting device, so that the entire discharge hole can be placed inside, and making it a shape whereby only the portion of the discharge hole through which the electronic components pass reliably fits into the electronic component insertion hole of the mounting device, and any variation therebetween.

In another arrangement of the present invention, a method such as inserting perforations along a tear-off line is used to provide the discharge hole at a predetermined position on the lead portion. That is, a tear-off portion can be torn away or removed and the discharge opening is thus formed at a predetermined position.

When tear-off pre-processing is carried out using a method such as inserting perforations along a predetermined tear-off line, so that the discharge hole is provided at a predetermined position on the discharge hole side lead portion, not only can the discharge hole be easily formed, but it can also be reliably formed at a predetermined position. This makes it possible to provide a discharge hole of predetermined shape at a predetermined position, and thereby enables the electronic components to be reliably supplied through the electronic component insertion hole to the mounting device, and improves adaptability of the storage container for automatic supply of electronic components.

Preferably, the electronic components are prevented from remaining inside the storage container by performing at least one of the following processes:

(a) curve-processing corners of the lead portion and the storage region, (b) when the electronic components are stored, chamfering or rounding the primary parts of the lead portion and the storage region, or (c) when the electronic components have been stored, the primary parts of the lead portion and the storage region are formed with smooth three-dimensional curves, so that there are no creases and cavities and the like on the main primary parts of their inner faces.

When at least one of the processes (a), (b) and (c) is carried out, it is possible to prevent the electronic components from being delayed by creases and cavities on the inner wall face, or remaining in the corners. As a result, the electronic components can be reliably supplied to the mounting device, further improving reliability.

BRIEF DESCRIPTION OF THE DRAWINGS

The foregoing, and other objects, features, and advantages of the present invention will be more readily understood upon reading the following detailed description in conjunction with the drawings, in which.

DESCRIPTION OF THE PREFERRED EMBODIMENTS

Preferred embodiments of the present invention are illustrated in FIGS. 1–5, and the features thereof are explained in greater detail below.

The storage container for electronic components according to one embodiment of the present invention is a container preferably comprising a bag-like container formed from flexible material. The container is used for storing a plurality of electronic components (for instance, chip-type laminated ceramic capacitors or the like) which are mounted using a mounting device (not shown in the diagram). There are no special constraints on the type of material used for the container, but normally, a resin material is preferably used. A transparent or semi-transparent material, through which the contents can be viewed from outside, is also preferred.

Figure 1:
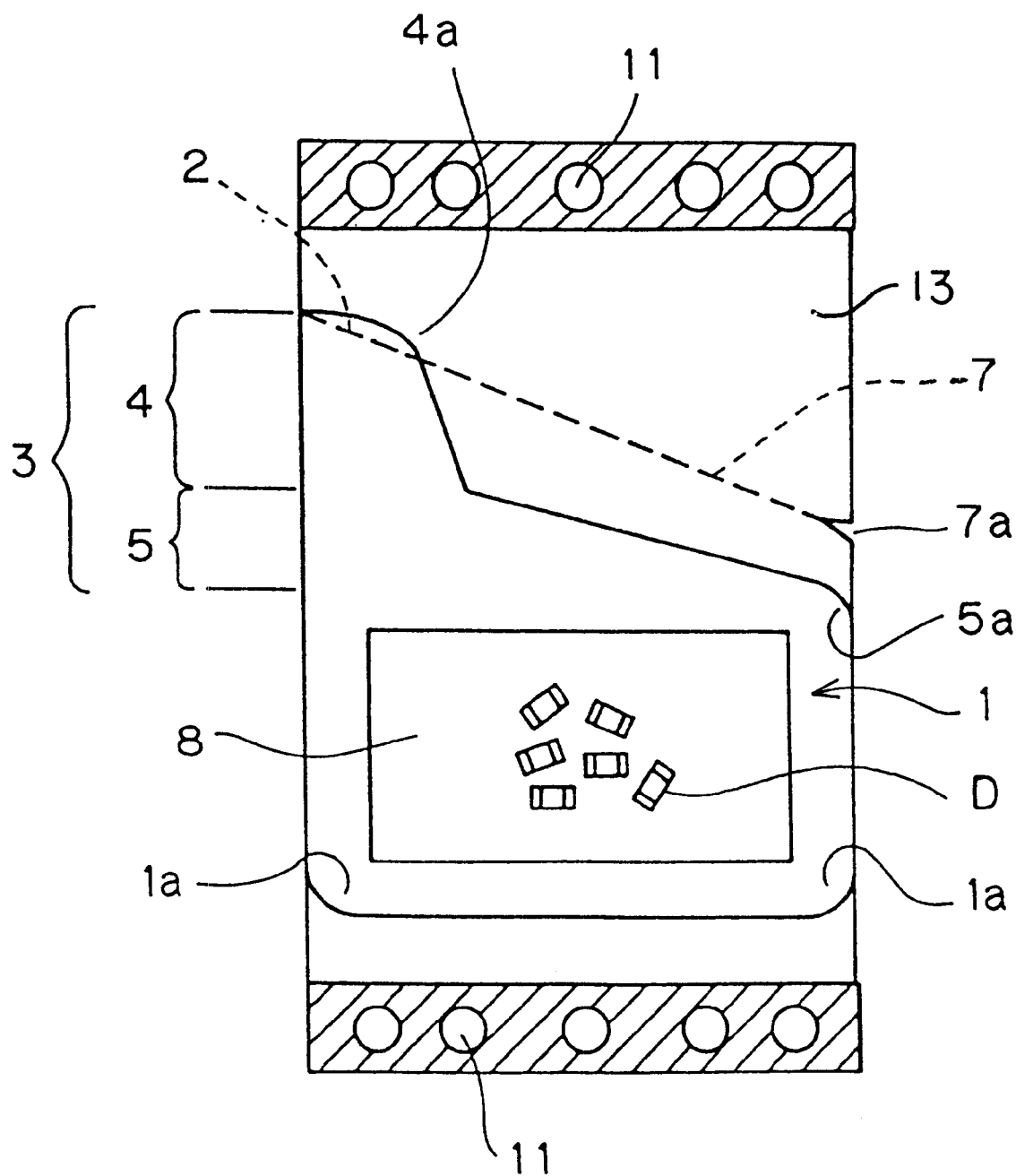
FIG. 1 is a plan view of a storage container for electronic components according to an embodiment of the present invention.
Figure 2:
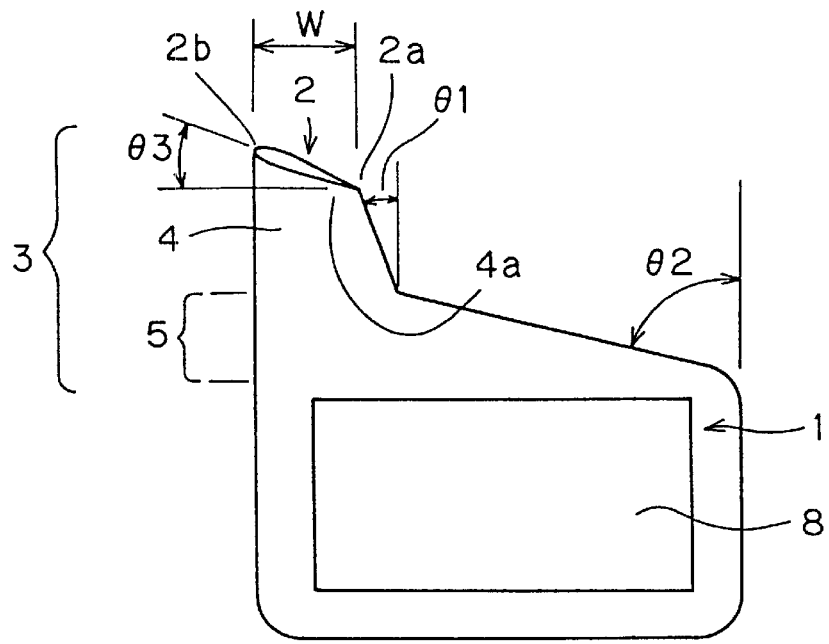
FIG. 2 is a diagram showing the shape of a taper (guide angle) and a discharge hole of a lead portion of the storage container for electronic components according to an embodiment of the present invention.
Figure 3:
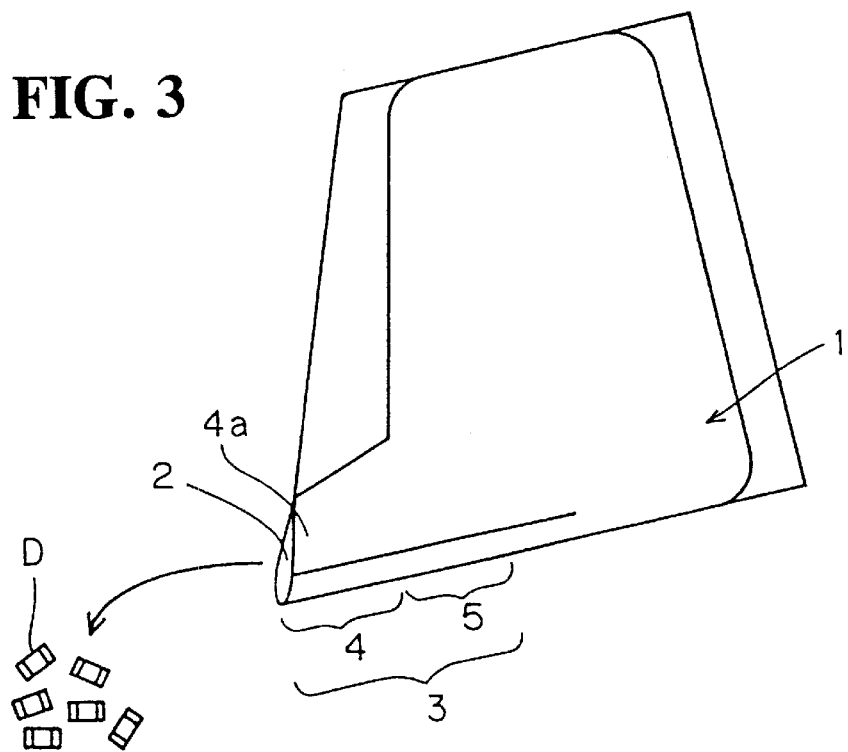
FIG. 3 is a diagram schematically showing the supplying electronic components from the storage container for electronic components according to an embodiment of the present invention.

As shown in FIGS. 1–3, the storage container comprises a storage region 1, in which a plurality of electronic components D are stored, and a lead portion 3 for leading the electronic components to a discharge hole 2.

The lead portion 3 includes a discharge hole side lead portion 4 having a taper (guide angle) θ1 provided at a side portion thereof so that the width of the side lead portion 4 becomes narrower toward the end 4a, which corresponds to the location of the discharge hole 2. The lead portion 3 also includes a storage region side lead portion 5 positioned between the storage region 1 and the discharge hole side lead portion 4 and having a taper (guide angle) θ2 provided at a side portion thereof so that the width of the side lead portion 5 becomes narrower toward the discharge hole side lead portion 4. Thus, the electronic components in the storage region 1 can be led to the discharge hole side lead portion 4 without delay.

Furthermore, an information display portion 8, for displaying product information such as product type, number and lot number, is provided on part of the outer rim face of the storage region 1 in such a way that the contents can be easily confirmed by sight.

In the preferred embodiment, the taper (guide angle) θ1 of the discharge hole side lead portion 4 (FIG. 2) is approximately 5 to 20°, so that the electronic components do not get stuck or otherwise lodged in the lead portion 3, and the taper (guide angle) θ2 of the storage region side lead portion 5 (FIG. 2) is approximately 20 to 70°, so that the electronic components can be reliably led to the discharge hole side lead portion 4. As should be apparent to one skilled in the art, the angles θ1 and θ2 should preferably be determined after considering the dimension and shape of the electronic components, the shape and dimension of the storage region and the lead portion, and the like. In some cases, it is foreseeable within the scope of the present invention that the angles θ1 and θ2 should be adjusted to lower or higher values than the above-mentioned ranges depending upon the variables of the particular application.

Furthermore, in the storage container of this embodiment, a tear-off portion 13 is provided, using a method such as inserting perforations along a predetermined tear-off line 7, to ensure that the discharge hole 2 is at a predetermined position on the end of the discharge hole side lead portion 4. To facilitate the removal of tear-off portion 13, a cutaway portion 7a may be provided at the end of the perforation line 7.

The discharge hole 2, which is formed by tearing along the perforation line 7, is smaller than the electronic component insertion hole of the mounting device, in order to ensure that when the discharge hole 2 (that is, the end 4a of the discharge hole side lead portion 4) is placed in the electronic component insertion hole of the mounting device, the electronic components can be reliably supplied to the mounting device without spillage occurring outside of the mounting device.

The width W of the discharge hole 2 (FIG. 2) should preferably be determined with due consideration to the dimensions of the electronic components. For instance, when the electronic components have dimensions of 3.2 mm×1.6 mm×1.2 mm, the width W of the discharge hole 2 should preferably be approximately 16–24 mm to ensure that the electronic components do not get caught or lodged therein.

To further prevent the electronic components from becoming lodged within the lead portion 3 or discharge opening 2, the angle θ3 (FIG. 2) of the discharge hole 2 is preferably 0 to 20°. The portion 2a, which is given a V-shape using the fold of the bag, shows the supply direction of the electronic components. The other portion 2b is left open, and functions as an outlet to prevent the electronic components from getting stuck. The angle θ3 should preferably be determined with due consideration to the shape of the discharge hole, the aspect of the electronic component insertion hole of the mounting device, and the like. Depending on the conditions of a particular application, it is possible that no angle θ3 may be needed.

Figure 4:
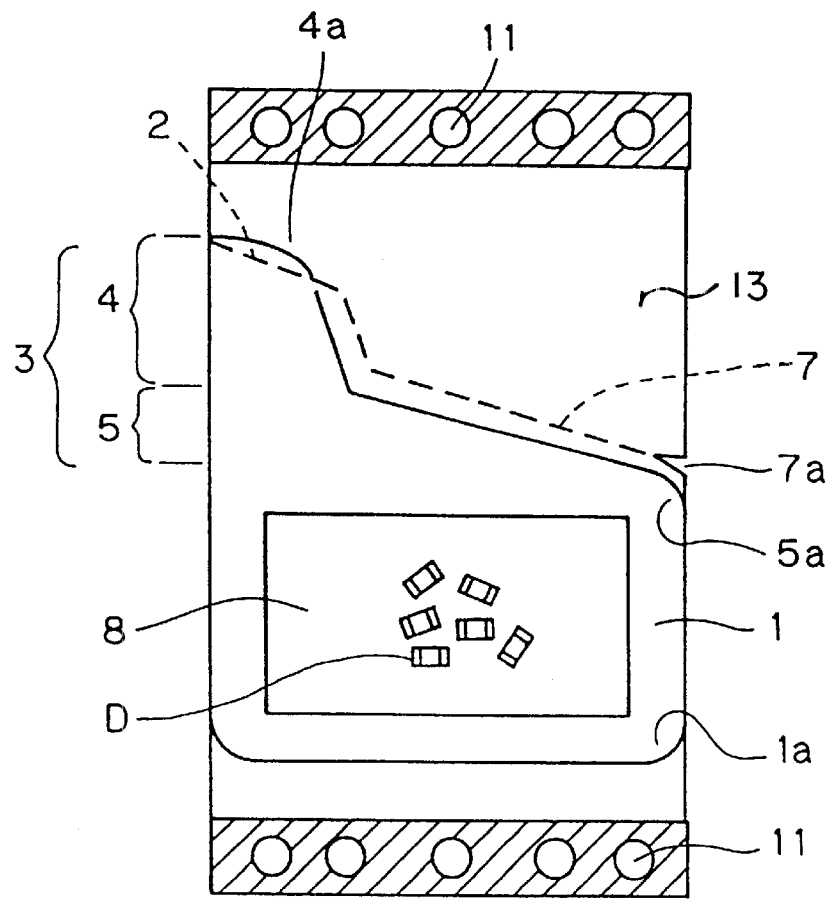
FIG. 4 is a diagram showing an example of a modification of the storage container for electronic components according to an embodiment of the present invention, in which perforations of a different pattern have been provided.

Referring also to FIG. 4, by providing the perforations 7 along the sides of the discharge hole side lead portion 4 and the storage region side lead portion 5 where the tapers are provided, the discharge hole side lead portion 4 can be made long and slim. Consequently, the discharge hole 2 can be inserted deeper into the electronic component insertion hole of the mounting device, thereby improving the reliability of the transfer from the storage container to the mounting device.

Furthermore, in the storage container of the present embodiment, the corner 1a of the storage region 1 and the corner 5a of the storage region side lead portion 5 are preferably curved to ensure that the electronic components do not remain at the corners. Additionally, the inner faces of the storage container which touch the electronic components are processed to prevent static electricity, so that the electronic components can be removed smoothly and without delay.

As shown in FIG. 1, in the storage container of the present embodiment, pin holes 11 may also be provided which engage with automated holding pins (not shown in the diagram) for automatically inserting the electronic components, and thereby function as a mechanism for carrying and positioning the electronic components. Consequently, the electronic components can be inserted automatically. Of course, as should be apparent to one skilled in the art, the pin holes 11 need not be provided when no automatic device is used.

As described above, the storage container of the present embodiment comprises a discharge hole side lead portion 4, having a taper (guide angle) θ1 so that its width becomes narrower toward the discharge hole 2, and a storage region side lead portion 5, positioned between the storage region 1 and the discharge hole side lead portion 4, and having a taper (guide angle) θ2 at one side portion thereof, so that its width becomes narrower toward the discharge hole side lead portion 4, thereby enabling the electronic components in the storage region 1 to be led to the discharge hole side lead portion 4 without delay. Therefore, when the electronic components are supplied to a mounting device, it is possible to prevent the electronic components from getting stuck or lodged therein, and thus supply them safely from the storage container to the mounting device.

Furthermore, since the corner 1a of the storage region 1 and the corner 5a of the storage region side lead portion 5 may be curved, and in addition, since the inner faces which touch the electronic components may be processed to prevent static electricity, so that the electronic components can be smoothly removed, the electronic components can be reliably supplied to the mounting device without being left inside.

The discharge hole 2, formed by removing the tear-off portion 13 along the perforations 7, is preferably smaller than the electronic component insertion hole of the mounting device, to ensure that the entire discharge hole 2 can be inserted into the electronic component insertion hole of the mounting device. Consequently, the electronic components can be reliably supplied to the mounting device without spillage.

Figure 5:
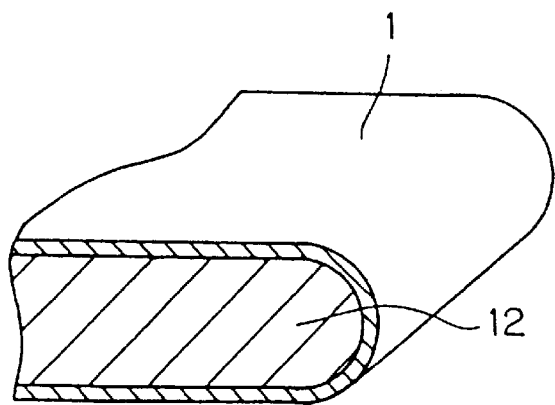
FIG. 5 is a perspective diagram showing an example of a modification of the storage container for electronic components according to an embodiment of the present invention.
Figure 6:
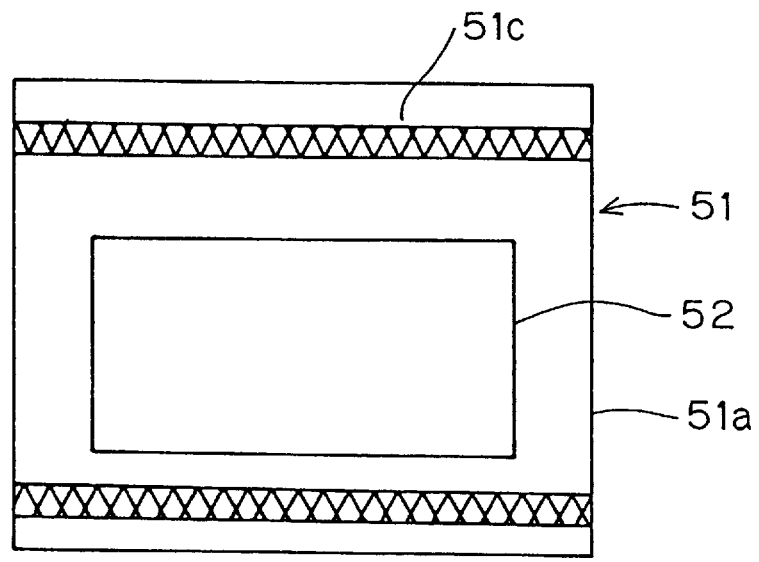
FIG. 6 is a diagram showing a storage container used in conventional bag-filling storage.
Figure 7:
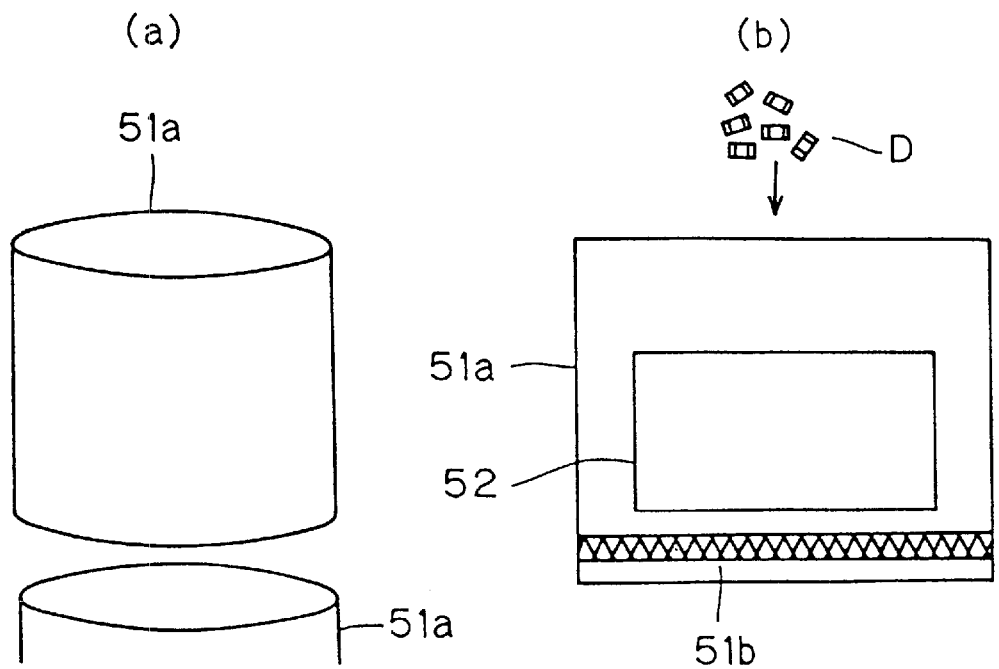
FIG. 7 is a diagram showing cylindrical material forming a conventional storage container, (a) showing the state when top and bottom end sides are not sealed, and (b) showing the state when the bottom end side has been sealed.

Furthermore, as shown in FIG. 5, surrounding parts of the storage container of the present invention, such as the storage region 1, and primary parts, such as the corners, can also be provided with curved surfaces by inserting a core 12 inside when forming the storage container and thereby shape the storage container with desired curved surfaces. In this case, delay of electronic components can be further prevented when being transferred from the storage container and the supply of the electronic components to the mounting device can be smoothly made.

Each of the above embodiments describes an example wherein the discharge hole side lead portion and the storage region side lead portion each have a taper (guide angle) provided at a side portion, but in some cases, it is also within the scope of the present invention to provide tapers on both side portions, thereby further narrowing the width, or on only one side portion.

The present invention is not to be limited to the described embodiments, and various adaptations and modifications can be made to the type of electronic components which are stored, the specific shape and dimensions of the storage region, the lead portions and the discharge hole, the type of mounting device, and the size of the tapers (guide angles), being within the scope of the main features of the invention.

As described above, the storage container for electronic components of the present invention comprises a storage region, a lead portion having a much shorter width than the storage region, provided with a taper (guide angle) so that its width becomes narrower toward the end which becomes the discharge hole. When the discharge hole is opened, electronic components are supplied from the storage region via the lead portion and the discharge hole, and therefore there is no bridge phenomenon, which could cause the electronic components to get stuck or otherwise lodged near the discharge hole of the storage container, and the electronic components can be reliably supplied from the storage region to a mounting device.

Furthermore, the discharge hole is at the end of a discharge hole side lead portion, and in addition, a taper (guide angle) θ1 is provided so that the width becomes narrower toward the discharge hole, and a storage region side lead portion, which becomes narrower toward the discharge hole side lead portion, is provided between the storage region and the discharge hole side lead portion. In addition, in the case where the taper (guide angle) θ2 of the storage region side lead portion is larger than the taper (guide angle) θ1 of the discharge hole side lead portion, the length of the storage region side lead portion can be shortened so that the whole storage container can be made smaller, and, since the taper (guide angle) θ1 at the discharge hole side lead portion is more gentle than the taper (guide angle) θ2 of the storage region side lead portion, the electronic components can be supplied even more smoothly to the mounting device.

When the discharge hole at the end of the lead portion is shaped so that it can be placed in the electronic component insertion hole of a mounting device, the electronic components can be reliably supplied to the mounting device without spilling to the outside, and thereby making the present invention more effective.

When the discharge hole is provided at a predetermined position on the discharge hole side lead portion, using a method such as inserting perforations along a predetermined tear-off line, not only can the discharge hole be easily formed, but it can also be reliably formed at a predetermined position. As a result, it is possible to provide a discharge hole of predetermined shape at a predetermined position, and the electronic components can be reliably supplied through the electronic component insertion hole to the mounting device, thereby improving adaptability for automatic supply of electronic components.

Furthermore, when at least one process is carried out of (a) curve-processing the corners, (b) processing the primary parts to a chamfered or curved shape, or (c) processing the primary parts of the lead portion and the storage region to three-dimensional curves, it is possible to further prevent the electronic components from remaining in the storage region and the lead portion, and to reliably supply the electronic components to the mounting device, thereby further improving reliability.

What is claimed is:

1. A storage container for storing a plurality of electronic components to be mounted using a mounting device, said storage container comprising:

a storage region having a width and capable of storing a plurality of electronic components;

a lead portion having a narrower width than the storage region, said lead portion being provided with a tapered guide angle such that its width becomes narrower toward one end thereof, said one end of the lead portion defining a discharge hole;

said lead portion includes a discharge hole side lead portion, an end of the discharge hole side lead portion forming said discharge hole and said discharge hole side lead portion having a tapered guide angle so that its width becomes narrower toward said discharge hole, said lead portion also including a storage region side lead portion, positioned between the storage region and the discharge hole side lead portion, said storage region side lead portion having a tapered guide angle so that its width becomes narrower toward said discharge hole side lead portion;

wherein when a plurality of electronic components are stored in the storage region and the storage container is used for supplying the plurality of electronic components to an electronic component injection hole of a mounting device, said discharge hole is opened and the electronic components can be supplied from the storage region via the lead portion and the discharge hole, and then from the electronic component insertion hole of the mounting device to the mounting device; and an electronic component in the storage region.

2. A storage container for electronic components according to claim 1, wherein the tapered guide angle of the storage region side lead portion is larger than the tapered guide angle of the discharge hole side lead portion.

3. A storage container for electronic components according to claim 2, wherein said discharge hole provided at said one end of the lead portion is dimensioned such that it can be inserted into an electronic component insertion hole of a mounting device.

4. A storage container for electronic components according to claim 2, further comprising a tear-off pre-processed portion, removal of said tear-off portion forming said discharge hole at a predetermined position on said lead portion.

5. A storage container for electronic components according to claim 3, further comprising a tear-off pre-processed portion, removal of said tear-off portion forming said discharge hole at a predetermined position on said lead portion.

6. A storage container for electronic components according to claim 1, wherein said discharge hole provided at said one end of the lead portion is dimensioned such that it can be inserted into an electronic component insertion hole of a mounting device.

7. A storage container for electronic components according to claim 1, further comprising a tear-off pre-processed portion, removal of said tear-off portion forming said discharge hole at a predetermined position on said lead portion.

8. A storage container for electronic components according to claim 4, wherein said tear-off pre-processed portion includes a plurality of perforations along a tear-off line.

9. A storage container for electronic components according to claim 1, further comprising means for substantially preventing electronic components from remaining inside the storage container, said prevention means including at least one selected from the group consisting of:

(a) curved corners of the lead portion and the storage region, (b) portions of the lead portion and the storage region having a chamfered shape, and (c) portions of the lead portion and the storage region having three-dimensional curves such that inner faces of the portions have no creases or cavities, thereby creating a substantially smooth curvature.

10. A storage container for electronic components according to claim 1, wherein said container includes a bag-type container formed from a flexible material.

11. A storage container for electronic components according to claim 1, wherein the storage region includes an interior surface formed of a material which prevents static electricity.

12. A storage container for electronic components according to claim 1, wherein the end of the discharge hole side lead portion forming the discharge hole has a tapered guide angle so that its width becomes narrower toward one side of the discharge hole.

13. A storage container for storing a plurality of electronic components to be mounted using a mounting device, said storage container comprising:

a storage region having a width and being capable of storing a plurality of electronic components;

a lead portion having a width narrower than the width of said storage region, the width of the lead portion becoming narrower toward one end thereof so as to form a tapered guide angle; and a discharge opening, said discharge opening being defined by said one end of the lead portion;

wherein said lead portion further includes a discharge hole side lead portion and a storage region side lead portion, said lead portion tapered guide angle defining a tapered guide angle of said discharge hole side lead portion, and said storage region side lead portion having a tapered guide angle in which its width becomes narrower toward said discharge hole side lead portion; and an electronic component in the storage region.

14. A storage container for electronic components according to claim 13, wherein the tapered guide angle of the storage region side lead portion is larger than the tapered guide angle of the discharge hole side lead portion.

15. A storage container for electronic components according to claim 13, wherein said tapered guide angle of said lead portion is between approximately five and twenty degrees.

16. A storage container for electronic components according to claim 13, wherein said tapered guide angle of said discharge hole side lead portion is between approximately five and twenty degrees and said tapered guide angle of said storage region side lead portion is between approximately twenty and seventy degrees.

17. A storage container for electronic components according to claim 13, further comprising a predefined tear-off portion, removal of said tear-off portion defining said discharge opening at a predetermined position.

18. A storage container for electronic components according to claim 13, wherein said storage container includes a bag-type container formed from a flexible material.

19. A method of making a storage container storing a plurality of electronic components to be mounted using a mounting device, said method comprising:

forming a container storage region having a width, the storage region being capable of storing a plurality of electronic components;

forming a container lead portion having a width narrower than the width of the storage region, the width of the lead portion becoming narrower toward one end thereof so as to form a tapered guide angle;

forming said lead portion having a discharge hole side lead portion and a storage region side lead portion, said lead portion tapered guide angle defining a tapered guide angle of said discharge hole side lead portion, and said storage region side lead portion having a tapered guide angle in which its width becomes narrower toward said discharge hole side lead portion;

providing a means for forming a container discharge opening; and providing an electronic component in the storage region.

20. A method of making a storage container according to claim 19, further comprising providing means for substantially preventing electronic components from remaining inside the storage container, said prevention means including at least one process selected from the group consisting of:

(a) curve-processing corners of the lead portion and the storage region, (b) processing primary parts of the lead portion and the storage region to a chamfered shape, and (c) processing primary parts of the lead portion and the storage region to three-dimensional curves such that inner faces of primary parts have no creases or cavities, thereby creating a substantially smooth curvature.

21. A storage container for storing a plurality of electronic components to be mounted using a mounting device, said storage container comprising:

a storage region having a width and capable of storing a plurality of electronic components;

a lead portion having a narrower width than the storage region and offset from a center of the storage portion width, said lead portion being provided with a tapered guide angle such that its width becomes narrower toward one end thereof, said one end of the lead portion defining a discharge hole;

said lead portion includes a discharge hole side lead portion, an end of the discharge hole side lead portion forming said discharge hole and said discharge hole side lead portion having a tapered guide angle so that its width becomes narrower toward said discharge hole, said lead portion also including a storage region side lead portion, positioned between the storage region and the discharge hole side lead portion, said storage region side lead portion having a tapered guide angle so that its width becomes narrower toward said discharge hole side lead portion; and an electronic component in the storage region;

wherein when a plurality of electronic components are stored in the storage region and the storage container is used for supplying the plurality of electronic components to an electronic component injection hole of a mounting device, said discharge hole is opened and the electronic components can be supplied from the storage region via the lead portion and the discharge hole, and then from the electronic component insertion hole of the mounting device to the mounting device.

22. A storage container in accordance with claim 21, wherein said lead portion comprises two sides which define said width, one of said two lead portion sides comprising a sidewall of the storage container.

23. A storage container in accordance with claim 21, wherein said lead portion comprises two sides which define said width, only one of said two sides comprising said tapered guide angle.

* * * * *